United States Patent [19]
Simcoe

[11] Patent Number: 6,000,008
[45] Date of Patent: Dec. 7, 1999

[54] METHOD AND APPARATUS FOR MATCHING DATA ITEMS OF VARIABLE LENGTH IN A CONTENT ADDRESSABLE MEMORY

[75] Inventor: Robert J. Simcoe, Westboro, Mass.

[73] Assignee: Cabletron Systems, Inc., Rochester, N.H.

[21] Appl. No.: 08/842,977

[22] Filed: Apr. 17, 1997

Related U.S. Application Data

[63] Continuation of application No. 08/029,853, Mar. 11, 1993, abandoned.

[51] Int. Cl.⁶ .............................. G06F 12/00; G11C 15/00
[52] U.S. Cl. ...................... 711/108; 365/49; 365/189.01; 711/202; 711/207
[58] Field of Search .............................. 365/49, 189.01; 711/108, 202, 207

[56] References Cited

U.S. PATENT DOCUMENTS

| | | | |
|---|---|---|---|
| 3,257,646 | 6/1966 | Roth | 365/49 |
| 3,261,000 | 7/1966 | Behnke | 365/49 |
| 3,264,616 | 8/1966 | Lindquist | 365/49 |
| 3,290,659 | 12/1966 | Fuller et al. | 365/49 |
| 3,353,159 | 11/1967 | Lee, III | 365/49 |
| 4,065,756 | 12/1977 | Panigrahi | 365/49 |
| 4,296,475 | 10/1981 | Nederlof et al. | 711/108 |
| 4,377,855 | 3/1983 | Lavi | 395/435 |
| 4,805,093 | 2/1989 | Wards | 364/200 |
| 4,845,668 | 7/1989 | Sano et al. | 365/49 |
| 4,907,194 | 3/1990 | Yamada et al. | 365/49 |
| 5,010,516 | 4/1991 | Oates | 365/49 |
| 5,053,991 | 10/1991 | Burrows | 365/49 |
| 5,175,860 | 12/1992 | Yamada | 395/435 |
| 5,222,222 | 6/1993 | Mehring et al. | 395/435 |
| 5,299,147 | 3/1994 | Holst | 395/49 |
| 5,319,762 | 6/1994 | Mayer | 395/425 |
| 5,329,405 | 7/1994 | Hou et al. | 395/800 |
| 5,383,146 | 1/1995 | Threewitt | 365/49 |
| 5,457,788 | 10/1995 | Machida | 395/435 |
| 5,463,751 | 10/1995 | Yonezawa et al. | 395/435 |

*Primary Examiner*—Tuan V. Thai
*Attorney, Agent, or Firm*—Wolf, Greenfield & Sacks, P.C.

[57] ABSTRACT

A content addressable memory (CAM) structure, and a method for its use, wherein data items of different selected lengths stored in the CAM may be located by matching sequences of CAM data words with sequences of input data words. Extension bits associated with each CAM data word control a sequence of comparison cycles to permit an input data item to be compared simultaneously with multiple input data items of the same length stored in the CAM structure. The CAM structure can be used without modification to store data items of various selected lengths. A begin bit associated with each CAM data word is used to mark the beginning of each stored data item and, in an exact match mode of operation, a global line is used to mark the beginning of an input data item. Match logic associated with each CAM data word generates a match till now signal in each comparison cycle, and the signal is propagated to the end of the data item if an exact match is detected. The exact match and match till now signals are used to generate various global match indications in the CAM structure. The same CAM structure can also be operated in a sliding match mode in which each stored data item is compared with every possible sequence of input data words.

16 Claims, 6 Drawing Sheets

INPUT WORDS

| | |
|---|---|
| | |
| | |
| WORD #4 | N | — |
| WORD #3 | S | O |
| WORD #2 | M | P |
| WORD #1 | S | I |

| | | V A L I D | B Y T E | B E G I N | MATCH TILL NOW | | | | |
|---|---|---|---|---|---|---|---|---|---|
| | | | | | #0 | #1 | #2 | #3 | #4 |
| X | X | 0 | 0 | 0 | 0 | 0 | 0 | 0 | 0 |
| S | I | 1 | 0 | 1 | 0 | 1 | 0 | 0 | 0 |
| M | P | 1 | 0 | 0 | 0 | 0 | 1 | 0 | 0 |
| S | O | 1 | 0 | 0 | 0 | 0 | 0 | 1 | 0 |
| N | X | 1 | 1 | 0 | 0 | 0 | 0 | 0 | 1 |
| X | X | 0 | 0 | 1 | 0 | 0 | 0 | 0 | 0 |

CAM DATA WORDS

*FIG. 7*

METHOD AND APPARATUS FOR MATCHING DATA ITEMS OF VARIABLE LENGTH IN A CONTENT ADDRESSABLE MEMORY

This application is a continuation of application Ser. No. 08/029,853, filed Mar. 11, 1993; now abandoned.

BACKGROUND OF THE INVENTION

This invention relates generally to content addressable memories, sometimes known as associative memories, and relates more particularly to content addressable memories having the ability to store variable length items of information. A content addressable memory includes a memory array in which data items have been stored, and are subsequently accessed by the content of the data items rather than their locations or addresses in the array. An input data item used to access the memory is compared with a large number of the stored data items and a match indication is provided. In many cases the match indication also yields a physical location, which may be used to access related information in a parallel memory structure. For example, if the content addressable memory contains employee badge numbers, a successful matching operation on a desired badge number can be used to access other information in an employee's record.

Most content addressable memories are capable of performing only fixed length comparisons, or a limited selection of fixed length comparisons, where the limited selection includes match lengths that are a subset of the longest available match word. For example, a content addressable memory (CAM) may have a 48-bit word size and be able to perform searches on words of less than 48 bits, but only by masking out the unused bits in each word, using a "don't care" indicator. It is obviously wasteful to use a large memory word in this way to hold a smaller amount of useful information.

The need to store words of various lengths in a CAM is particularly acute in the computer networking field. Various network protocols allow 16-bit, 32-bit and 48-bit station or node addresses, and some allow variable length addresses as large as 160 bits. To accommodate all of these possibilities in a conventional CAM would be costly in the extreme.

Some early CAM designs proposed handling variable length data. For example, U.S. Pat. No. 3,257,646, issued in the name of Robert I. Roth, proposed a scheme in which the beginning and the end of each data word were designated by special characters, and the beginning and end of each field within a word was designated by another special character. A comparator using a complex system of shift registers was used to permit data words and fields to straddle physical word boundaries in the CAM.

There is clearly still room for improvement in the field of CAMs for handling variable length data. The present invention is directed to this end.

SUMMARY OF THE INVENTION

The present invention resides in a simple but effective content addressable memory structure that can be used without modification to store many different types of data of different forms, and to locate a selected item of data stored in the memory. The same structure may also be used for database matching on variable length search strings.

Briefly, and in general terms, the content addressable memory (CAM) structure of the invention comprises a set of CAM data words, each having a selected number of data bits and a plurality of control bits, including a match till now bit; means for inputting one word at a time of input data for simultaneous comparison with data stored in all of the CAM data words; a comparator circuit associated with each CAM data word, for comparing the contents of the CAM data word with a word of input data, and generating a word match signal as a result of the comparison; match logic associated with each CAM data word, for generating a match till now signal indicating whether this CAM data word and preceding data words back to the beginning of a stored data item have all matched with a corresponding succession of input data words; and means associated with each CAM data word, for generating an exact match signal if the match till now signal is generated in a CAM data word containing the last word of a stored data item.

The CAM structure of the invention may also include global match logic, for generating global match signals based on the match till now signals and exact match signals generated in all of the CAM data words. The global match logic includes intermediate match and multiple match lines to give an indication of how the comparison is progressing. These may be used, for example, to extract information about the closest match when an exact match is not found. More specifically, the global match logic includes means for generating a global intermediate match signal if at least one match till now signal is set to indicate that at least a partial match condition exists; means for generating a global match signal if at least one exact match signal is set to indicate an exact match; and means for generating a global multiple match signal if more than one match till now signal is set to indicate the finding of a partial match.

Use of these global match signals will be described in more detail, but in brief the global intermediate match signal indicates that there is currently at least one partial match condition, and the global multiple match signal indicates that there is more than one such partial match condition. When the global intermediate match signal is extinguished, the search can be terminated because all the match till now signals have been extinguished. The best or closest match can be located in the CAM data at this point. If the global multiple match signal is extinguished at the same time as the global intermediate signal, multiple match till now signals were extinguished at the same time and it may be difficult to identify the best or closest match.

One of the control bits associated with each CAM data word is a begin bit indicating that the CAM word contains the first word of a data item. The basic function of the match logic associated with each CAM data word is to generate a new setting for the match till now bit based on the values of the begin bit, the word match signal, the match till now bit associated with an adjacent CAM data word, and a global signal indicating that the current input data word is the first word of an input data item. The begin bit marks the beginning word in a stored data item and the "first word" global line indicates the first word in an input data item. For exact matching, the first word in the input data item is compared with the first words of all stored items; then the second words are compared, and so forth until another begin bit is encountered.

More specifically, the match logic associated with each CAM data word includes means for setting the match till now bit if the begin bit is set, if the first word of input data is being compared, and if the word match signal indicates a match. Therefore, the match till now bit will be set if the first words of data items in the CAM and the input data match. The match logic further includes means for setting the match till now bit if the begin bit is not set and if the match till now bit from the adjacent (previously matched) CAM data word was set, and if the word match signal indicates a match. In other words, for second and subsequent matching words in a stored data item, the match till now bit will be set only if it was set in the previously matched data word and if there is a word match indication. The match logic further includes means for clearing the match till now bit in all other cases, specifically if there is no word match for this CAM data word, or if the begin bit is set but this is not the first word of input data, or if the begin bit is not set and there was no match in the previously compared CAM data word for this data item. The effect of this logic is that a matching first word of a stored data item will have its match till now bit set, and then the match till now bit will be propagated from one data word to the next if there are matches in subsequent corresponding words in the CAM and input data.

In the illustrative embodiment of the invention, the means for generating an exact match signal includes means for logically combining the match till now bit with the begin bit of the next adjacent CAM data word. Therefore, the exact match signal is set when both the match till now bit is set and the begin bit is set in the next adjacent CAM data word.

Optionally, one of the control bits of the CAM data words is a subfield bit indicating that a subfield of the last data word in a stored data item does not contain valid data. This bit is referred to in the detailed description as the byte bit, indicating that the last byte of a word, usually the last word, is invalid and should not be used in the comparison process. The comparator circuit includes means responsive to the subfield bit, for forcing a match result for a subfield that contains invalid data in the last data word of a stored data item. Therefore, a data item need not completely fill the last data word. The length of each data item may then be measured in bytes (or some smaller subfield) rather than complete data words.

Another of the control bits of each CAM data word is designated the valid bit, and indicates whether or not the data word contains valid data. The comparator circuit includes means for forcing the word match signal to indicate no match if the valid bit is not set. Use of the valid bit ensures that improper comparisons will not be made on invalid stored data that may coincidentally match the input data.

In terms of a novel method, the invention comprises the steps of inputting one word at a time of input data for simultaneous comparison with data stored in all of the CAM data words; comparing, in a comparator circuit associated with each CAM data word, the contents of the CAM data word with a word of input data, and generating a word match signal as a result of the comparison; generating in each CAM data word a match till now signal indicating whether this CAM data word and preceding CAM data words back to the beginning of a stored data item have each matched with corresponding words in a succession of input data words; and generating in each CAM data word an exact match signal if the match till now signal is generated in a CAM data word containing the last word of a stored data item.

The method may also include the step of generating global match signals based on the match till now signals and exact match signals generated in all of the CAM data words. The step of generating global match signals further includes generating an global intermediate match signal if at least one match till now signal is set to indicate that at least a partial match condition exists; generating a global exact match signal if at least one exact match signal is set to indicate the finding of an exact match; and generating a global multiple match signal if more than one match till now signal is set.

More specifically, the step of generating a match till now signal is based on the values of the begin bit, the word match signal, the match till now bit associated with an adjacent (previously compared) CAM data word, and a global signal indicating that the current input data word is the first word of an input data item. The step of generating a match till now signal includes setting the match till now bit if the begin bit is set, if the first word of input data is being compared, and if the word match signal indicates a match; setting the match till now bit if the begin bit is not set and if the match till now bit from the adjacent CAM data word was set, and if the word match signal indicates a match; and otherwise clearing the match till now bit.

In the method of the invention, the step of generating an exact match signal includes logically combining the match till now bit with the begin bit of the next adjacent CAM data word, whereby the exact match signal is set when both the match till now bit is set and the begin bit is set in the next adjacent CAM data word. The comparing step of the invention may also include forcing a match result for a subfield that contains invalid data in the last data word of a stored data item, as indicated by the subfield bit. The comparing step may also include forcing the word match signal to indicate no match if the validity bit is not set in a CAM data word.

It will be appreciated from the foregoing summary that the present invention represents a significant advance in the field of content addressable memories. In particular, the invention provides a convenient approach to storing and locating data items of various lengths, without modification of the memory structure, without wasteful use of the memory and without complex logic to keep track of memory usage. Other aspects and advantages of the invention will become apparent from the following more detailed description, taken in conjunction with the accompanying drawings.

BRIEF DESCRIPTION OF THE DRAWINGS

FIG. 7 is a diagram depicting an example of an exact match search using the CAM structure of the invention;

DESCRIPTION OF THE PREFERRED EMBODIMENT

Figure 1:
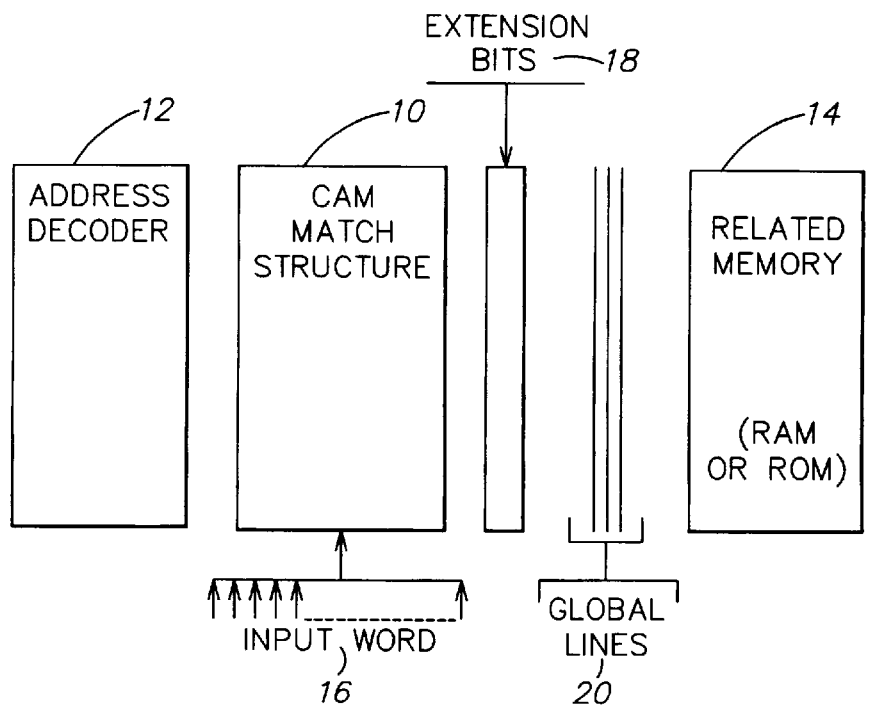
FIG. 1 is a block diagram showing the principal components of the content addressable (CAM) structure of the present invention.

As shown in the drawings for purposes of illustration, the present invention is concerned with improvements in content addressable memory (CAM) circuits. Most conventional CAMs permit comparison of fixed length data entries or a shorter length if the remainder of each entry position in the CAM is wasted. For example, a CAM may be configured to store and locate 32-bit data words but could be used to store and search for 16-bit words by treating the unused sixteen bits of each word as always matching under a "don't care" condition.

In accordance with the present invention, data items of various lengths stored in a CAM match structure are addressed by inputting the contents of one of these items to the CAM structure. The principal components of the CAM of the invention are shown in FIG. 1, including the CAM match structure, indicated by reference numeral 10, an address decoder 12 used to address the CAM when initially storing data items, and a related memory 14, which may be a random access memory (RAM) or a read-only memory (ROM). Typical CAM usage involves locating a data item in the CAM match structure, such as an employee identification number or name. The item is specified by means of a sequence of input words 16, each of which is compared simultaneously with data stored in the CAM match structure 10. When an exact match is found for the entire input data item, the apparatus can retrieve additional information concerning the requested item from the related memory 14, such as a pointer to a complete employee record. The address obtained as a result of searching the CAM match structure 10 is used to facilitate retrieval of a pointer to the related information from the memory 14.

The variable match length CAM of the invention makes use of a number of extension bits 18 associated with each word of the CAM. These will later be explained in more detail. Also associated with the CAM match structure 10 are a number of global signal lines 20, some of which are used to carry information or control signals to every memory word in the structure, and others of which are used to carry match information out of the structure.

For purposes of explanation, the CAM match structure 10 will be assumed to comprise a large number of 16-bit data words, each having two 8-bit data bytes. This structure is convenient for many applications, but can obviously be changed to meet specific requirements. There are four extension bits 18 associated with each word of memory, including:

(1) A valid bit, to indicate whether the data stored in the word is currently valid. A binary "1" means that the word contains valid data.

(2) A byte bit, to indicate whether the data stored in the second byte of the word is valid. The byte bit is usually only of significance for the last word in a stored data item. As illustrated in this specification a binary "1" means that the second byte does not contain valid data.

(3) A begin bit to indicate whether the data stored in the word is the first word in a data item. A binary "1" means that the word is the first word.

(4) A match till now bit, to indicate whether this and all preceding data words have matched with corresponding input data words. A binary "1" indicates a match.

Figure 2:
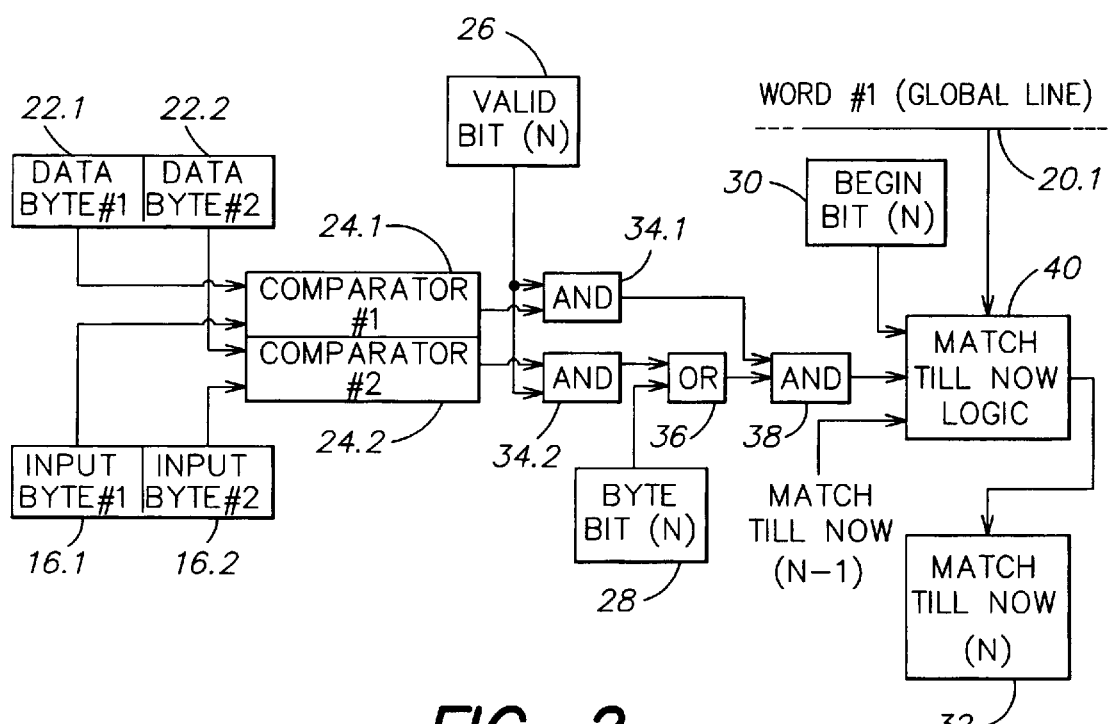
FIG. 2 is a block diagram showing the comparison logic for a single CAM data word of the structure of FIG. 1.

The way these extension bits are used in an exact match is illustrated in FIGS. 2–6. As shown in FIG. 2, each word of the CAM includes two data bytes, indicated at 22.1 and 22.2, two byte comparators 24.1, 24.2, a valid bit 26, a byte bit 28, a begin bit 30, and a match till now bit 32. An input word, indicated as two bytes 16.1, 16.2, is input to the respective comparators 24.1, 24.2, in which a comparison is made with the respective data bytes 22.1, 22.2, and byte match output signals are generated. The byte match signals are input to two AND gates 34.1, 34.2, respectively, each AND gate having as another input the value of the valid bit 26. Thus, the outputs of the byte comparators 24.1, 24.2 are enabled only if the valid bit is set to a binary "1." The validated match output of the second byte, i.e. from AND gate 34.2, is input to an OR gate 36, the other input of which is derived from the byte bit 28. Thus, when the byte bit 28 is a binary "1," indicating that the second byte of the word is not valid data, the validated match output of the second comparator 24.2 is forced to a "1" by the byte bit, indicating that the second byte of the word matches. The two byte match signals are then combined in another AND gate 38, to produce a word match signal for this word of the CAM.

In each comparison cycle, a new match till now bit value is computed for each word of the CAM. This is shown generally in FIG. 2 by match till now logic 40, which has four input lines from which a new value of the match till now bit 32 is computed. The four inputs are: (1) the word match signal from AND gate 38, (2) the begin bit for this CAM word, indicated as Begin Bit (N), (3) the match till now bit from the word before this one in the CAM structure, indicated as Match Till Now (N−1), and (4) a connection from a global line 20.1 referred to as the Word #1 line. A global line is one that extends through all of the memory words and is used to convey information to or from the memory words. In this case, the global line 20.1 indicates that the current comparison cycle is comparing against an input word that is the first in a succession of words making up a complete input data item. Another way to think of the Word #1 line is that it conveys the same information for the input data words that the begin bit conveys for the data words stored in the CAM.

It will observed from FIG. 2 that the match till now bit is computed from three types of signals: signals stored with or generated from the data word, global signals distributed to all data words, and signals associated with an adjacent word (e.g., the match till now bit from the prior word in the data item). As will be further discussed below, each CAM word also makes use of the begin bit from the next succeeding data word, and other global lines are used in operation of the CAM structure. In a sense the input data words 16 are also global signal lines, since they transmit input data to all of the CAM words simultaneously. The match till now logic 40 will now be described in more detail with reference to FIG. 3.

Basically, the new match till now value is computed in AND gate 44, which takes the logical AND of the word match signal for this CAM word (output from AND gate 38, FIG. 2), and a second signal obtained from a multiplexer 46. The second signal has one of three values: binary "0," binary "1," or the match till now signal from the prior data word in the data item. The selection of the second input signal to AND gate 44 is made by an encoder 48, which generates a control signal for the multiplexer 46 based on the values of the Word #1 signal and the begin bit. The encoder function is defined by an associated truth table 50 in FIG. 3.

Figure 3:
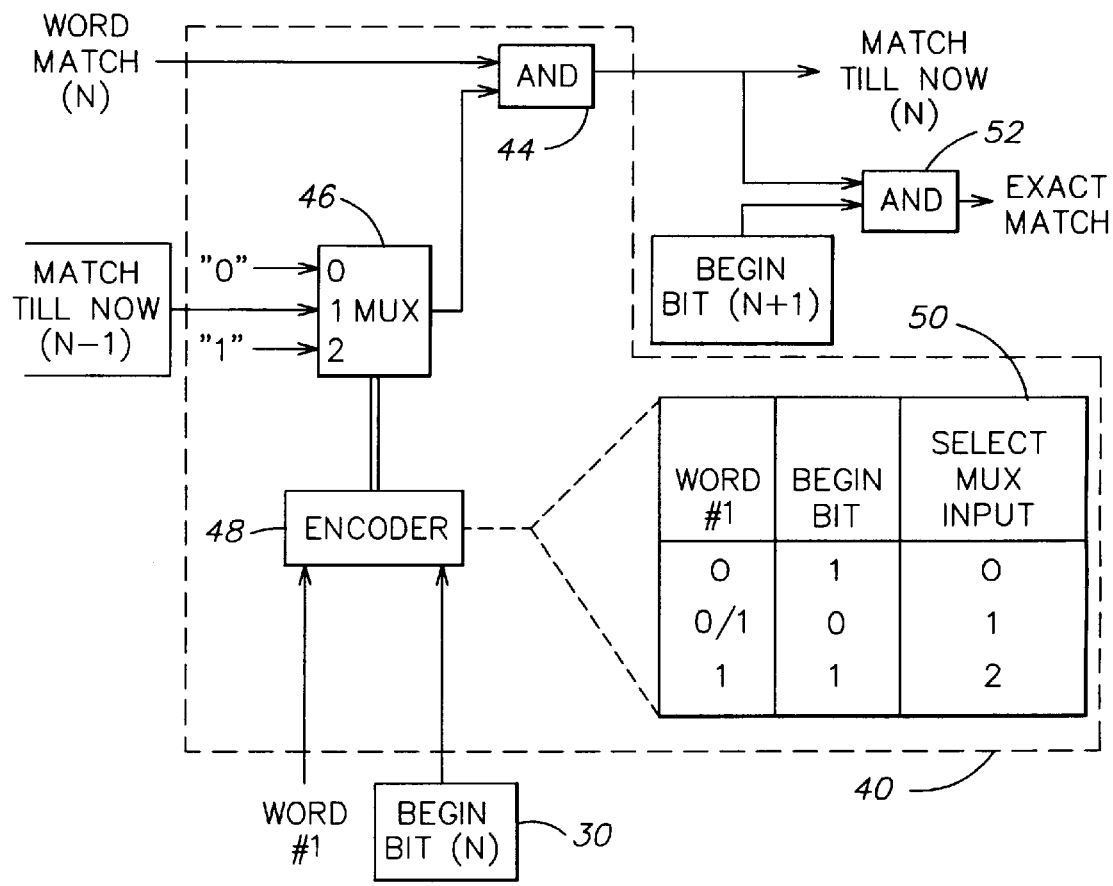
FIG. 3 is a more detailed logic diagram of the match till now logic shown in FIG. 2.

The logic of FIG. 3 and its truth table define the operation of the CAM in an exact match mode of operation. The purpose of the exact match mode is to locate a succession of CAM data words that exactly matches a corresponding succession of input words.

Initialization

Prior to any comparison of input and stored data, the match till now bits are reset to binary "0" in all of the CAM data words.

First Comparison Cycle

The Word #1 line 20.1 is true (binary "1") and the first input word is compared with all of the CAM words in memory. For those words that have the begin bit set, indicating the first word of a stored data item, the result of the comparison will be stored in the match till now bit for this CAM data word. As indicated in the third line of the truth table 50, when the Word #1 line is true and the begin bit is set, multiplexer input #2 will be selected, and a binary "1" will be input to the AND gate 44. Therefore, the word match signal for this CAM word will be entered into the match till now bit. For CAM words that do not have the begin bit set, encoder 46 selects input #1 of the multiplexer 46, and the new match till now bit is determined by logically ANDing the current word match signal and the match till now signal from the prior CAM word. Since all the match till now bits were initially reset to "0," the result of this ANDing operation will be to obtain a logical "0" value for the match till now bit. At the conclusion of the first comparison cycle, therefore, all the CAM words with begin bits set will have been compared with the first of the input data words, and will have their match till now bits set if there was a successful match.

Second and Subsequent Comparison Cycles

When the second data word is input to the CAM, the Word #1 line 20.1 will no longer be true. In CAM words in which the begin bit is set, the comparison will be performed in accordance with the first line of the truth table 50, i.e. input #0 will be selected for the multiplexer 46, and a binary "0" will applied to AND gate 44, forcing the match till now bit to a "0" value. Therefore, each CAM data word with the begin bit set will have its match till now bit reset to "0" on comparison with a second or subsequent input word, regardless of whether or not the match till now bit was previously set to "1." For CAM words that do not have the begin bit set, the comparison will be dictated by the second line of the truth table 50, i.e. input #1 of the multiplexer 46 will be selected, and the new value of the match till now bit will depend on the current word match signal and the prior (N-1) match till now signal. For second data words in a stored item, the new match till now bit will be set if the current data word matches and the data in the first data word also matched. In other words, the match till bit will be propagated from the first data word to the second data word in the CAM structure. It will be understood that the comparison cycles discussed with reference to FIG. 3 require appropriate clocking signals, which have not been described but are relatively straightforward to implement. In particular, the clocking signals must ensure that the match till now bit will not be extinguished before it is propagated to the next CAM data word. In some implementations, this may require the use of an intermediate storage cell for the match till now signal.

Last Data Word Comparison Cycle

Further successive comparison cycles are terminated when a CAM word containing a set begin bit is next encountered. Specifically, in each comparison cycle, the begin bit from the next CAM word (N+1) is ANDed with the match till now bit for the current word, as indicated by AND gate 52. The output of this AND gate provides an exact match signal, which means that a match till now "1" bit was propagated from a first word (containing a set begin bit) through to a last data word without being extinguished by a non-matching comparison operation. Because the comparison cycles of the CAM are terminated based on detection of a begin bit in a succeeding data word, initialization of the CAM data words must include setting the begin bit in the word following the last word of the last stored data item.

When the CAM contains data items of various lengths, some mechanism must be included in the search technique to make sure that the search is not improperly terminated by encountering a short but coincidentally matching data item in the CAM. For example, a data item three words long might match the first three words of a longer input data item. The begin bit following the shorter item would terminate the search and yield a false exact match indication. The simplest approach to avoid this problem is to specify that the first word (or byte) of each data item stored in the CAM must contain a data item class designation, where the term "class" implies that items of the same class have the same length. Upon comparison of the first input data word, the method of the invention will automatically eliminate all stored CAM items not of the designated class. All items still in the search will be of the same class and have the same length in memory.

Figure 4:
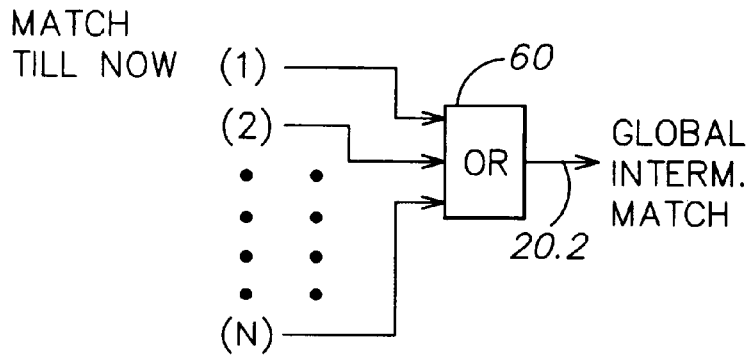
FIGS. 4–6 are a logic diagrams showing the generation of global match signals from the comparison logic of FIGS. 2 and 3.
Figure 5:
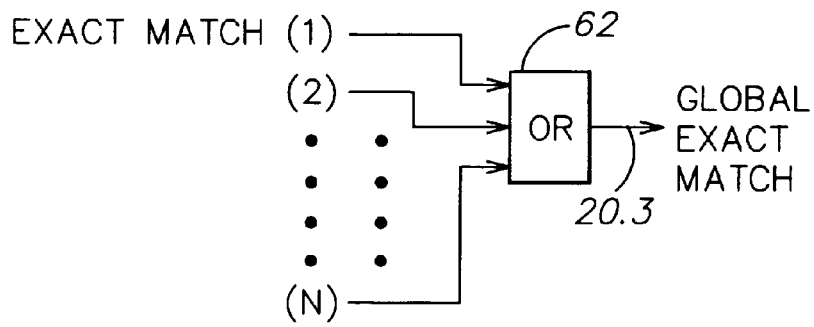
Figure 6:
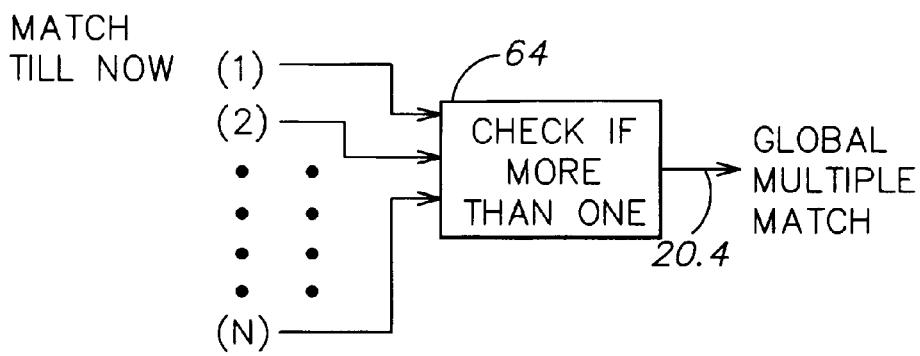

FIGS. 4–6 depict how three global match lines are generated. As shown in FIG. 4, all of the match till now bits are logically ORed together, as shown by OR gate 60 to produce a global intermediate match signal 20.2. So long as there is at least one nonzero match till now bit, the global intermediate match line is a binary "1," indicating that the matching process is still continuing. If the global intermediate match line falls to binary "0" there are no more match strings "alive" and the matching process may be prematurely terminated. This could be used to identify the closest match by logic (not shown) that monitors the global intermediate match line 20.2.

FIG. 5 shows the development of a global exact match signal on line 20.3. This is obtained by logically ORing all of the exact match lines obtained from AND gate 52 in each word, as indicated by OR gate 62. So long as one exact match is obtained for the entire data item, this line will be set to binary "1."

FIG. 6, shows the generation of a global multiple match line 20.4. All of the match till now signals are examined in logic 64 to determine if more than one of them indicates a match. The logic 64 may, for example, include means for accumulating the voltage levels used to represent the binary "1" signals on the match till now lines, and them comparing the accumulated result with a selected threshold to determine if there is more than one match till now signal. The global multiple match signal on line 20.4 may be used in conjunction with the global intermediate match signal on line 20.2 to determine the closest match in the event there is no exact match. When the global intermediate match signal on line 20.2 is extinguished, this signifies that all match till now signals have been extinguished. The last match till now signal to survive can be identified and the corresponding partially matching data retrieved. However, if the global intermediate match signal on line 20.2 is extinguished at the same time as the global multiple match signal on line 20.4, this signifies that multiple partially matching strings of data failed to match at the same time. In this situation, it is more difficult to identify the closest match.

It will be appreciated from the foregoing description that, in the exact match mode of operation, a sequence of input data words is compared with sequences of stored data words in the CAM. The first word of the input sequence is compared with the first word of each stored data item, as indicated by begin bits, and then subsequent words of the input sequence are compared with corresponding words of the store data items. On a successful match, a binary "1" match till now bit will be propagated to the last word in each matching data item stored in the CAM.

Figure 8:
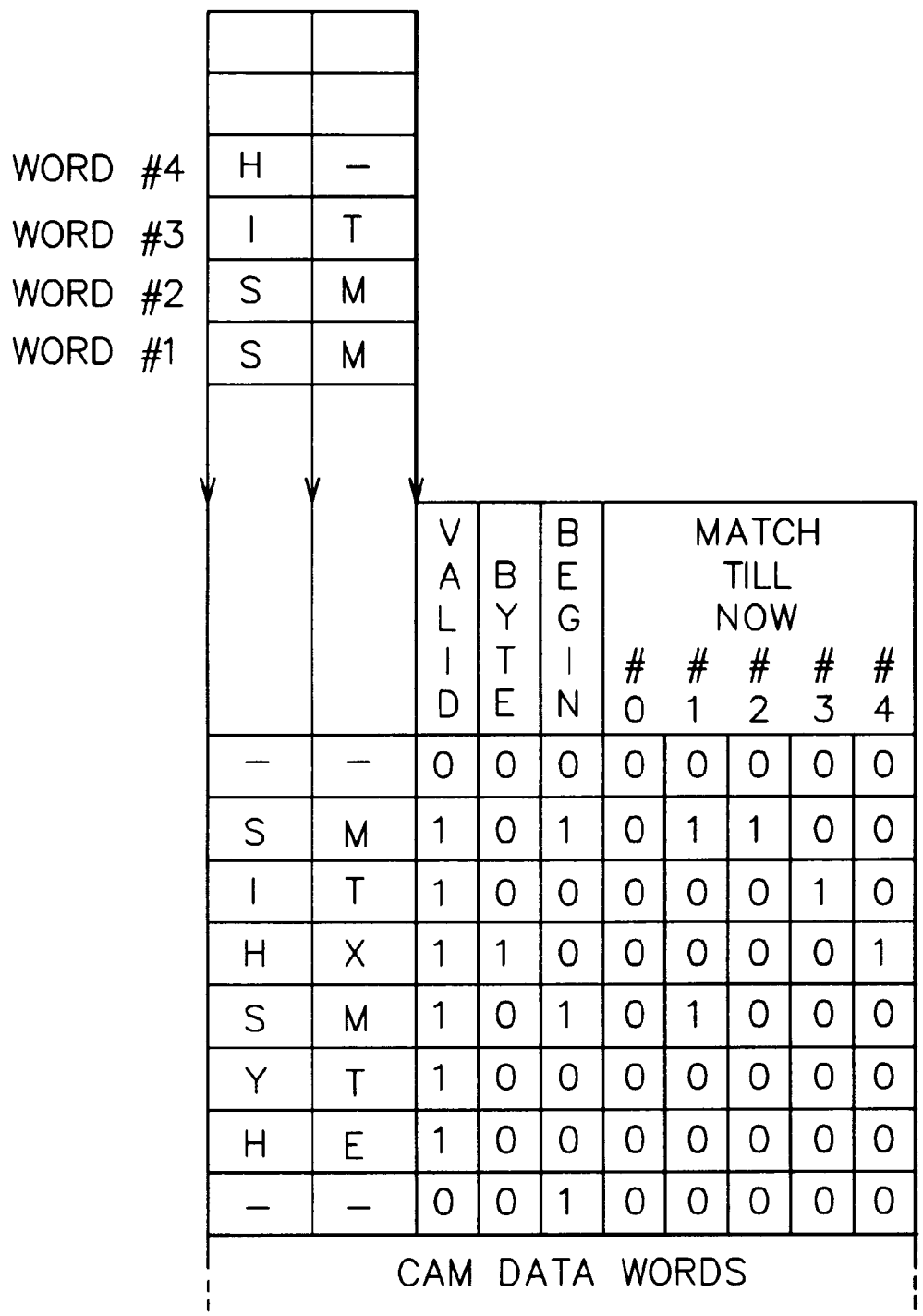
FIG. 8 is a diagram similar to FIG. 7, but showing operation of the invention in a sliding search mode.

Another mode of operation of the CAM structure of the invention is referred to as the running match mode. The purpose of the running match mode is to compare each data item stored in the CAM with any succession of the same number of data words input to the CAM. The fundamental difference between the exact match mode and the running match mode is that the Word #1 line has no significance in the running match mode. Every input data word has an opportunity to start a successful matching sequence, beginning with a stored word with the begin bit set. FIGS. 7 and 8 are examples showing the two modes of operation, and specifically what happens to the match till now bits at each comparison cycle in the two modes.

In the exact match mode example shown in FIG. 7, input words #1 through #4 represent the alphabetic codes for the name SIMPSON. Alphabetic codes are chosen for ease of illustration, but it will be understood that the input words and the CAM data words may contain numeric data. Four consecutive CAM data words are shown as containing an identical pattern of characters. These are the CAM words in which the valid bit is set to binary "1." It is also of interest that the last of these words has the byte bit set to "1" to indicate that the last word does not contain valid data in the second byte, that the first word has the begin bit set, and that the word after the last word has the begin bit set.

The match till now bits for each of the CAM data words are shown in the remaining columns for successive comparison cycles. Initially (comparison cycle #0), the match till now bits are all set to "0." In cycle #1, the match till now bit for the word containing SI and having the begin set is set to "1" to indicate a first-word match condition. On the next cycle (#2), there is a match in the word containing the characters MP, and the match till now bit gets set because the match till now bit in the prior word was set. Therefore, the match till now bit is propagated from the word containing SI to the word containing MP. The same thing happens on subsequent comparison cycles, until the match till now bit is set in the cell containing the letter N, the last character of the input stream. Since the next word contains a set begin bit, this will result in the determination of an exact match condition.

FIG. 8 differs from FIG. 7 in that the input steam provides no indication of the first word of a data item being searched for. A match condition results whenever a data item stored in the CAM (as defined by the begin bits) matches a succession of input words found anywhere in the input stream. In this example, the input data words are shown to include the characters SMSMITH, and the CAM data words are shown to include two successive data items: SMITH and SMYTHE. Word #1 of the input data contains SM and will be seen to match two CAM data words having their begin bits set. Therefore, the match till now bits of these words will be set on the first comparison cycle. However, the second data word, also containing SM, will not match with either of the second words (the words after the ones having the begin bit set). Therefore, both of the match till now bits started by the first data input word will be extinguished. Since the second input data word also contains SM, input of this word will again set the match till now bits in the two CAM words with the begin bit set. When the third data input word, containing IT, is compared against the CAM words, a match is found only in the word containing IT. This match till now bit will be propagated and the other one will be extinguished in the word containing YT. The fourth input data word, containing the character H, will also find a match in the CAM word containing H, and the match till now bit will propagated to the end of the word SMITH in the CAM. Because the next CAM word has the begin bit set, this will result in an exact match indication.

The search depicted in FIG. 8 is referred to as a sliding match, because one or more data items in the CAM can be compared against all possible input sequences containing the same number of consecutive words. The sliding search may be used to search a stream of data input from a database, for one or more desired data items stored in the CAM. The sliding match mode can be easily implemented by forcing the word #1 line 20.1 to be "true" or binary "1." Then every input data word may start a new sequence of comparison cycles. At any stage of the search, there may be multiple match till now bits set in a stored data item.

Figure 9:
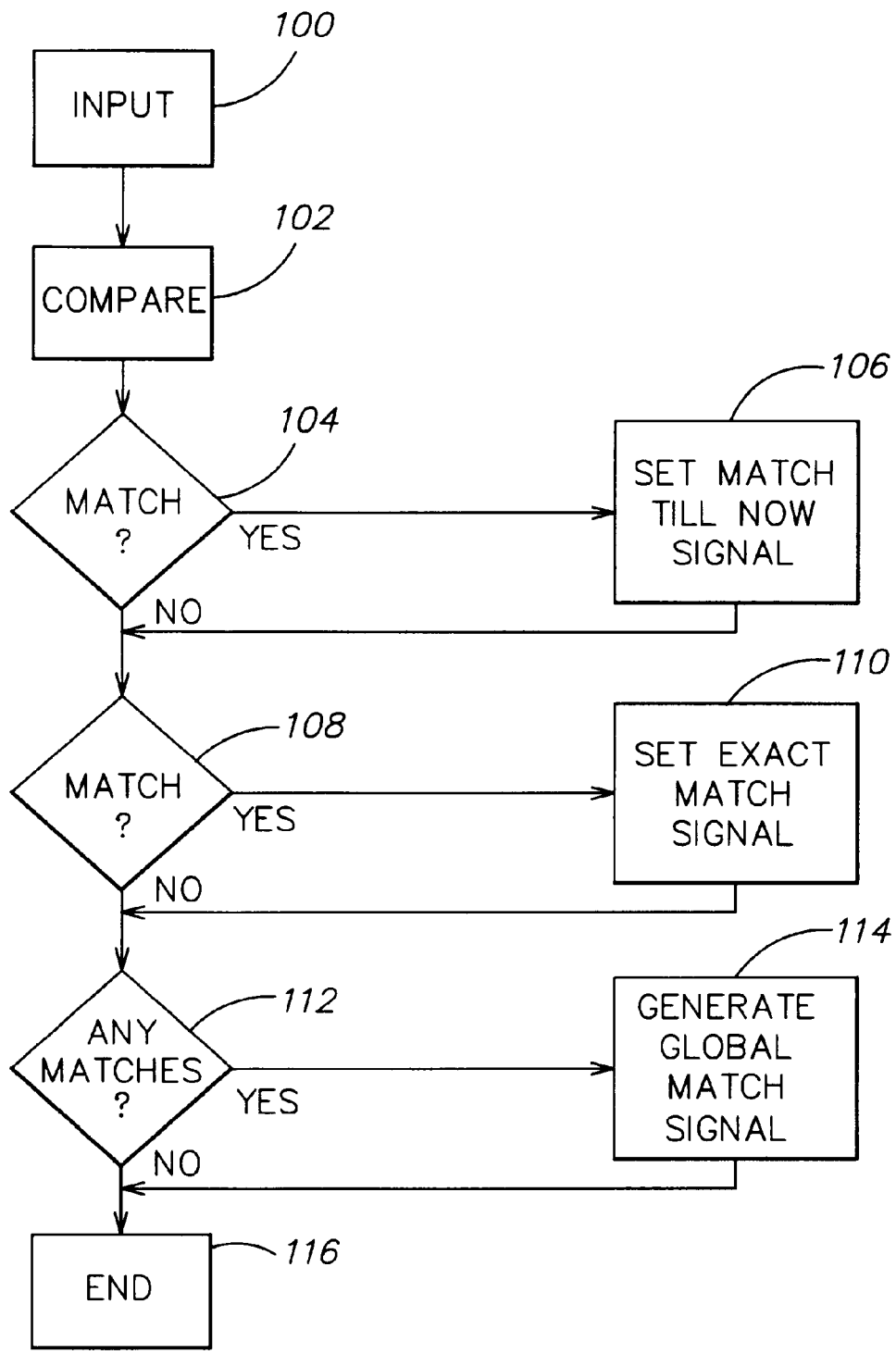
FIG. 9 is a flow chart showing the principal steps of the present invention.

Referring to FIG. 9, a flow chart showing the principal steps of the present invention is illustrated. At step 100 one word at a time of input data for simultaneous comparison with data stored in all of the CAM data words is imputted. At step 102, the contents of the CAM data word with a word of input data is compared. At step 104, the process checks for a match. If there is a match, at step 106 a word match signal as a result of the comparison is generated. At step 108, the process determines whether this CAM data word and preceding data words back to the beginning of a stored data item have all matched with a corresponding succession of input data words. If so, at step 110 a match till now signal is generated. At Step 112, the process checks whether the match till now signal was generated in a CAM data word containing the last word of a stored data item. If so, at step 114, a global match signal is generated. At step 116, the process ends.

It will be appreciated from the foregoing that the present invention represents a significant advance in the field of content addressable memories. In particular, the invention provides a convenient technique for using CAMs to store data items of various lengths, without having to restructure the CAM or perform complex logical manipulations. It will also be appreciated that, although a specific embodiment of the invention has been described in detail for purposes of illustration, various modifications may be made without departing from the spirit and scope of the invention. Accordingly, the invention should not be limited except as by the appended claims.

I claim:

1. A content addressable memory (CAM) structure for storing and locating data items of various lengths, the structure comprising:

a set of CAM data words, each having a predetermined number of data bits and a plurality of control bits, including a match till now bit and a begin bit to be set when a respective CAM data word contains a first word of a stored data item;

means for inputting one word at a time of a sequence of input data words for simultaneous comparison with all of the CAM data words;

a comparator circuit associated with each respective CAM data word, for comparing the respective CAM data word with the inputted one word of input data, and generating a word match signal for the respective CAM data word as a result of the comparison;

match logic associated with each CAM data word, for generating a match till now signal indicating that the CAM data word and a preceding CAM data word have matched with a corresponding succession of input data words;

means associated with each CAM data word, for generating an exact match signal if the match till now signal is generated for the respective CAM data word and the respective CAM data word contains a last word of a stored data item; and global match logic, for generating global match signals based on the match till now signals and exact match signals generated in all of the CAM data words, wherein the match logic determines a setting for the match till now bit of the respective CAM data word based on the begin bit, the respective word match signal, a setting of the match till now bit associated with a preceding CAM data word, and a global signal indicating that a current input data word is a first word of an input data item.

2. A CAM structure as defined in claim 1, wherein the global match logic includes:

means for generating a global intermediate match signal if at least one match till now signal is generated to indicate that at least a partial match condition exists.

3. A CAM structure as defined in claim 1, wherein the global match logic includes:

means for generating a global exact match signal if at least one exact match signal is generated.

4. A CAM structure as defined in claim 1, wherein the global match logic includes:

means for generating a global multiple match signal if more than one match till now signal is generated.

5. A CAM structure as defined in claim 1, wherein the match logic includes:

means for setting the match till now bit of the respective CAM data word if the begin bit is set, if the first word of input data is being compared, and if the respective word match signal indicates a match, wherein the respective match till now bit will be set if the first word of the CAM data word and the first word of the input data match;

means for setting the match till now bit if the begin bit is not set, if the match till now bit from the preceding CAM data word is set, and if the word match signal indicates a match, wherein a subsequent matching CAM data word will have its match till now bit set only if the match till now bit was set in a preceding CAM data word; and means for clearing the match till now bit of the respective CAM data word in all other conditions.

6. A CAM structure as defined in claim 5, wherein:

the means for generating an exact match signal include means for logically combining the respective match till now bit with the begin bit of a next succeeding CAM data word, the exact match signal being set when both the respective match till now bit is set and the begin bit is set in the next succeeding CAM data word.

7. A CAM structure as defined in claim 5, wherein:

one of the control bits of the CAM data word is a subfield bit indicating that a last subfield of the CAM data word does not contain valid data; and the comparator circuit includes means, responsive to the subfield bit, for generating a match result for a subfield that does not contain valid data.

8. A CAM structure as defined in claim 5, wherein:

the global signal indicating a first input data word is always set, to indicate that every input word is to be treated as potentially starting an input data item; and each stored data item is compared with all possible sequences of input data words having a same match length as the stored data item.

9. A method of operation of a content addressable memory (CAM) structure for storing and locating data items of various lengths, the CAM structure including a set of CAM data words, each having a predetermined number of data bits and a plurality of control bits, including a match till now bit and a begin bit to be set when a respective CAM data word contains a first word of a stored data item, the method comprising the steps of:

inputting one word at a time of a sequence of input data words for simultaneous comparison with all of the CAM data words;

comparing, in a comparator circuit associated with each respective CAM data word, the respective CAM data word with the inputted one word of input data, and generating a word match signal for the respective CAM data word as a result of the comparison;

generating for each CAM data word a match till now signal indicating whether the respective CAM data word and a preceding CAM data word have matched with a corresponding succession of input data words;

generating for each CAM data word an exact match signal if the match till now signal is generated for the respective CAM data word and the respective CAM data word contains a last word of a stored data item; and generating global match signals based on the match till now signals and exact match signals generated in all of the CAM data words, wherein the step of generating a match till now signal for the respective CAM data word is based on the begin bit, the respective word match signal, the match till now bit associated with a preceding CAM data word, and a global signal indicating that a current input data word is a first word of an input data item.

10. A method as defined in claim 9, wherein the step of generating global match signals includes:

generating a global intermediate match signal if at least one match till now signal is generated to indicate that at least a partial match condition exists.

11. A method as defined in claim 9, wherein the step of generating global match signals includes:

generating a global exact match signal if at least one exact match signal is generated.

12. A method as defined in claim 9, wherein the step of generating global signals includes:

generating a global multiple match signal if more than one match till now signal is generated.

13. A method as defined in claim 9, wherein the step of generating a match till now signal includes:

setting the match till now bit of the respective CAM data word if the begin bit is set, if the first word of input data is being compared, and if the respective word match signal indicates a match, wherein the respective match till now bit will be set if the first word of the CAM data word and the first word of input data match;

setting the match till now bit if the begin bit is not set, if the match till now bit from the preceding CAM data word is set, and if the word match signal indicates a match, wherein a subsequent matching CAM data word will have its match till not bit set only if the match till now bit was set in a preceding CAM data word; and otherwise clearing the match till now bit of the respective CAM data word.

14. A method as defined in claim 13, wherein the step of generating an exact match signal includes logically combining the respective match till now bit with the begin bit of a next succeeding CAM data word, the respective exact match signal being set when both the respective match till now bit is set and the begin bit is set in the next succeeding CAM data word.

15. A method as defined in claim 13, wherein:

one of the control bits of the CAM data word is a subfield bit indicating that a last subfield of the CAM data word does not contain valid data; and the comparing step includes generating a match result for a subfield that does not contain valid data, as indicated by the subfield bit.

16. A method as defined in claim 13, wherein the method further comprises the step of setting the global signal indicating the first word of input data so that every input word is treated as potentially starting an input data item; and each stored data item is compared with all possible sequences of input data words having a same match length as the stored data item.

* * * * *